(12) United States Patent
Hsu et al.

(10) Patent No.: US 6,522,551 B2
(45) Date of Patent: Feb. 18, 2003

(54) METHOD AND APPARATUS FOR MOUNTING ELECTRONIC COMPONENTS WITHIN A RACK SYSTEM

(75) Inventors: Ching-I Hsu, Warren, NJ (US); Richard Bopp, Belle Mead, NJ (US); Alan Chen, Taipei (TW)

(73) Assignee: Raritan Computer, Inc., Somerset, NJ (US)

( * ) Notice: Subject to any disclaimer, the term of this patent is extended or adjusted under 35 U.S.C. 154(b) by 0 days.

(21) Appl. No.: 09/729,632

(22) Filed: Dec. 4, 2000

(65) Prior Publication Data

US 2002/0067601 A1 Jun. 6, 2002

(51) Int. Cl.⁷ .............................. H05K 5/00; H05K 5/04; H05K 5/06
(52) U.S. Cl. ...................... 361/752; 361/730; 361/753; 361/825; 211/26
(58) Field of Search .............................. 361/725–730, 361/752, 753, 796, 797, 825–829; 312/223.1, 223.2; 211/26, 183, 90; 248/659

(56) References Cited

U.S. PATENT DOCUMENTS

| | | | | |
|---|---|---|---|---|
| 5,571,256 A | * | 11/1996 | Good et al. ................... 211/26 |
| 6,021,909 A | * | 2/2000 | Tang et al. .................. 211/183 |
| 6,220,456 B1 | * | 4/2001 | Jensen et al. ................ 211/189 |
| 6,230,903 B1 | * | 5/2001 | Abbott ........................ 211/190 |
| 6,305,556 B1 | * | 10/2001 | Mayer .......................... 211/26 |
| 6,320,749 B1 | * | 11/2001 | Ayres et al. ................ 361/730 |

* cited by examiner

Primary Examiner—Albert W. Paladini
Assistant Examiner—Tuan Dinh
(74) Attorney, Agent, or Firm—Ward & Olivo

(57) ABSTRACT

A method and apparatus for mounting an electronic component within a rack system is provided comprising a modular equipment rack bracket for electronic equipment including a first and second mounting bracket arm for mounting to a rack assembly and a frame member for supporting a plurality of electrical supply cabling, signal cabling or data cabling and the like. The first and second mounting bracket arms are affixed to the front of the rack assembly and have associated therewith a plurality of fastener openings for attaching electronic components thereto. The frame member is coupled to one of a plurality of coupling means of the first and second mounting bracket arms allowing the electronic component to be affixed to the mounting bracket in either a front-facing forward configuration or a rear-facing forward configuration without removing the affixed first and second mounting bracket arms from the rack assembly.

39 Claims, 8 Drawing Sheets

METHOD AND APPARATUS FOR MOUNTING ELECTRONIC COMPONENTS WITHIN A RACK SYSTEM

FIELD OF THE INVENTION

The invention relates in general to the field of electronic component enclosures, and, more particularly, to an object for mounting a electronic system component within a rack assembly.

BACKGROUND OF THE INVENTION

Many systems have been proposed for racking and storing electronic equipment such as computer equipment, audio-visual equipment, musical equipment and the like. Specifically, numerous systems have been developed for computer equipment consisting of multiple components that require electrical supply cable connections and signal or data cable interconnections for each component. Therefore, in order to neatly, safely and efficiently store numerous pieces of equipment, a rack system is generally utilized. Electronic equipment such as computer components are often arranged in "drawers" or units having particular dimensions and fasteners which permit mounting within a vertical rack or load-bearing frame. Rack-mountable components are widely used because they are easily installed or removed. A rack system also permits a flexible system configuration.

In many computer environments, including large-scale operations such as data centers, server-farms, web-hosting facilities and call centers, as well as small-scale computer environments, space is an important concern. For a computer environment to operate efficiently, electronic components are often neatly racked allowing for access to the components for installation and removal. Furthermore, a rack system provides access to the components for connecting the electrical supply cables and the data cables. As various types of electronic equipment have become more complex, more densely packaged and more compact in size, vertical frames known in the prior art have proved deficient or disadvantageous in several ways.

It is common in electronic equipment construction to mount electronic equipment in drawers or slide units which slide into a suitable equipment rack in spaced parallel relationship. The "drawers" often comprise modular instrument housings which slide into suitable slots in the rack, or support structure. Most of the electronic equipment in the rack must be interconnected. The interconnection of the electronic components can cause problems when changes must be made to the overall system mounted on the rack or to any of the individual electronic components mounted to the rack.

In electronic equipment applications, numerous types of electronic equipment are often placed in a rack system. Different equipment manufacturers or distributors of electronic equipment often do not employ a consistent programming format and protocol. That is, there is little uniformity in the location and distribution of display panels, input/output connections and wiring interfaces of similar electronic equipment produced by different manufacturers. Even when identical programming formats and protocols are used, details of the placement of display panels, input/output connections and wiring interfaces differ from manufacturer to manufacturer. Therefore, many electronic assemblies that have identical electrical characteristics are not interchangeable without some sort of programming or reconfiguration.

There are also often mechanical differences between electronic equipment supports or drawers designed to slide into an equipment rack. These differences prevent easy interchangeability. The differences include rather simple items such as connector quantity, location, size and pin allocation. These seemingly trivial problems force conventional rack wiring and rack component placement to undergo extensive re-work when a system has to be reconfigured. Expensive, complex, and time consuming reconstruction, often beyond the capability of field personnel, must be performed. Thus, rack wiring and rack component placement has been a major impediment to all previous attempts to provide easy racking of systems.

As electronic components become more densely packed, more heat is generated and ventilation becomes critically important to ensure that the components will function properly. Prior art frames designed for use with less densely packed components are often not able to accommodate larger ventilation grilles or fans due to interfering structural members. Many conventional frames include structural members which, because of location or orientation, place severe restrictions on the design of exterior panels, doors, grilles and the like.

Thus, it is well known in the art to provide a rack system for storing and operating electronic components in an organized and accessible manner. However, numerous inventions have been proposed which limit the access to each of the racked electronic components. For example, in order to access any of the wiring interfaces for the interconnection of the electronic equipment to other components in the rack, one must turn the rack system housing around to access the rear of the rack system and the racked electronic components. This proves to be very difficult in many situations where space is limited in addition to situations where extensive cabling is required to operate a multitude of electronic components. Therefore, it is often desirable to mount several pieces of electronic components with the rear of the unit facing forward. In order to mount electronic equipment in this manner, a new bracket would be required that is specifically designed for mounting the electronic components with the rear-facing-forward. Thus, it is desirable to provide a rack system which employs a modular equipment rack bracket which allows for any type of electronic equipment to be mounted in either a front-facing-forward configuration or a rear-facing-forward configuration without requiring the user to utilize more than one equipment rack bracket.

Rinderer U.S. Pat. No. 5,284,254 discloses a rack for electrical equipment including a base having a bottom wall, and a back wall extending up from the bottom wall at the back of the rack. The bottom wall has a plurality of fastener openings therein through which fasteners may be driven into a surface supporting the rack for securing the rack to the surface. A pair of legs extend up from the bottom wall of the base at opposite sides of the base adjacent the back wall of the base. A cover may be removably fastened to the base of the rack in a position where the cover extends forward from the back wall of the base between the legs of the rack and is spaced above the bottom wall of the base to form, in combination with the back and bottom walls of the base, an enclosure for electrical wiring and the like. Removal of the cover from the base provides ready access to the electrical wiring and the like and also the fastener openings in the bottom wall of the base for facilitating securement of the rack to the surface. However, Rinderer fails to disclose a rack bracket and method for installing an electronic component in either front-facing-forward configuration or a rear-facing-forward configuration. Furthermore, Rinderer fails to disclose a frame member for supporting a plurality of electrical cabling for either a front-facing-forward or a rear-facing-forward electronic component for reducing the weight strain of the cabling on the electronic component's cabling interfaces.

Mills U.S. Pat. No. 5,791,498 discloses a rack mount mechanism that includes first and second recessed slides fixed in a stationary position and first and second mounting brackets slideably mounted on the first and second recessed slides, respectively. The first and second mounting bracket arms each have front and back ends extending, for example, perpendicularly inward from the base of the mounting brackets. A frame is included which is attachable to the computer enclosure and has front and back rails. Each rail has an edge extending, for example, perpendicularly outward from the base of the rail and each edge has a plurality of apertures. An angled bar-nut is coupled to each of the rails by threading the angled portion of each angled bar-nut through an aperture in the edge of the rail and including a screw and a cage nut to secure the angled portion of each angled bar-nut to the edge of each rail. The front and back ends of the first and second mounting brackets are positioned between and coupled to each angled bar-nut and the edge of the front and back rails, respectively. However, Mills fails to disclose a method and apparatus for installing an electronic component in either a front-facing-forward configuration or a rear-facing-forward configuration including a frame member for supporting a plurality of electrical cabling.

Hull U.S. Pat. No. 5,794,794 discloses a modular rack system for supporting electronic equipment, comprising vertical and lateral frame members cooperating to form a vertical supporting frame, and shelf or rack members supported from a front of the frame for carrying the electronic equipment, wherein the vertical and horizontal frame members comprise channel members with walls defining continuous longitudinal openings at a rear of the frame and cooperating to form a system of interconnected raceways for receiving cables for forming connections to and between the electronic equipment, the walls of the channel shaped members defining ports for passing end connectors of cables. However, Hull fails to disclose a rack bracket and method for installing an electronic component in either a front-facing-forward or a rear-facing-forward configuration. Furthermore, Hull fails to disclose a frame member for supporting a plurality of electrical cables for either a front-facing-forward or a rear-facing-forward electronic component for reducing the weight strain of the cabling on the electronic component's cabling interfaces.

Ott et al. U.S. Pat. No. 5,945,633 discloses a rack mountable cable distribution enclosure. The cable distribution enclosure includes a tray that slides forwards and backwards out of the cable distribution enclosure. The tray includes an adapter plate bracket which receives a plurality of adapter plates. The adapter plates are mounted in a horizontal orientation, parallel to the sliding tray. However, Ott et al. fails to disclose a method and apparatus for installing an electronic component in either a front-facing-forward or a rear-facing-forward configuration.

Gibbons U.S. Pat. No. 6,123,203 discloses a system and method for mounting a desk side computer system component within a housing. The mounting system includes a component chassis that defines an interior space, a mating slot formed in the component chassis that provides access to the interior space, an adaptive mounting ear and an insertion tab associated with the adaptive mounting ear. The adaptive mounting ear may be operable to simultaneously couple both the housing and the component chassis. When coupling the adaptive mounting ear to the component chassis, the insertion tab is inserted through the mating slot associated with the component chassis and into the interior space defined by the component chassis. The insertion tab remains within the interior space when the adaptive mounting ear is coupled to the component chassis. However, Gibbons is limited to mounting a desk side computer system component. Furthermore, Gibbons fails to disclose a mounting bracket and method for installing an electronic component in either a front-facing-forward or a rear-facing-forward configuration. Gibbons fails to disclose a frame member for supporting a plurality of electrical cables for either a front-facing-forward or a rear-facing-forward electronic component for reducing the weight strain of the cabling on the electronic component's cabling interfaces.

Therefore, it is desirable in the art to provide a simple method and apparatus for installing and removing an electronic component in either a front-facing-forward configuration or a rear-facing-forward configuration within a rack system.

Further, it is an object of the present invention to provide a modular equipment rack bracket for use with a plurality of electronic components.

Furthermore, it is an object of the present invention to provide a modular equipment rack bracket for use with a standard rack system in addition to other known rack systems.

In addition, it is particularly desirable to provide a simple method and apparatus for mounting an electronic component in a rack system wherein one electronic device may be easily and quickly substituted for another electronic device.

It is further desirable to provide a simple method and apparatus for mounting an electronic component in either a front-facing-forward electronic component or a rear-facing-forward configuration within a rack system while allowing the electronic components within the rack to easily interface with one another.

It is also desirable to provide a modular equipment rack bracket and method for storing electronic components in a rack system that allows for ease of access to the electronic equipment.

It is still a further object of the present invention to provide a method and apparatus for mounting electronic components within a rack system that is strengthened for use in areas prone to seismic occurrences.

In view of the foregoing, clearly there exists a need for an improved method and apparatus for installing or removing numerous types of electronic components in either a front-facing-forward configuration or a rear-facing-forward configuration within a rack system. Furthermore, it remains a requirement in the art to provide an electronic equipment rack bracket that is compatible with a plurality of electronic components and can be affixed to a standard rack system, in addition to similar rack systems known in the art, which allows for ease of access in removing and installing electronic components. Further, it is desirable in the art to provide an electronic equipment rack bracket which relieves the strain of heavy cables on the interfaces of racked electronic components.

SUMMARY OF THE INVENTION

An object of the present invention is to provide a modular equipment rack bracket for use in a standard rack system that supports an array of electronic components supplied by different equipment manufacturers or distributors of electronic equipment. In addition, another object of the present invention is to offer a modular equipment rack bracket that provides a substantial degree of organization of the associated cables of an array of electronic components.

Disclosed is an improved method and apparatus for installing or removing numerous types of electronic components in either a front-facing-forward configuration or a rear-facing-forward configuration within a rack system. This invention provides a modular equipment rack bracket for supporting electronic components in a rack system which is compatible with a multitude of electronic components. In addition, the invention provides a modular equipment rack bracket that allows for any equipment component to be affixed to the rack system with the front-facing-forward or the rear-facing-forward without requiring modification of the individual components. The electronic equipment may be affixed to the rack system allowing for access to the wiring interfaces from either the front of the rack system or the rear of the rack system. Since many manufacturers and distributors of electronic equipment use numerous platforms for electronic components which employ minimal uniformity in the location and distribution of display panels, input/output connections and wiring interfaces it is desirable in the art for an equipment rack bracket to exhibit characteristics that allow for multiple choices in affixing electronic components in a single rack.

A modular equipment rack bracket for electronic equipment is disclosed including a first and second mounting bracket arm for mounting to a rack assembly and a frame member for supporting a plurality of electrical supply cabling, signal cabling or data cabling and the like. The first and second mounting bracket arms each have a front end and a back end. The front end of the first and second mounting bracket arms is affixed, for example, perpendicularly to the front of the rack assembly thereby allowing the first and second mounting bracket arms to extend inwardly within the rack assembly. The first and second mounting bracket arms have associated therewith a plurality of attachment means for attaching a multitude of electronic components thereto. In addition, the first and second mounting bracket arms comprise a plurality of coupling means for perpendicularly affixing the frame member thereto. The frame member is coupled to one of a plurality of coupling means of the first and second mounting bracket arms allowing the electronic component to be affixed to the mounting bracket arms in either a front-facing configuration or a rear-facing configuration without removing the affixed first and second mounting bracket arms from the rack assembly. The frame member is provided for supporting a plurality of electrical cabling for either a front-facing-forward electronic component or a rear-facing-forward component thereby reducing the weight strain of the cabling on the electronic component's cabling interfaces. In addition, the apparatus may further include optional bracing so that the rack is strengthened for use in areas prone to seismic occurrences.

Other objects, features and characteristics of the present invention, as well as the methods of operation and functions of the related elements of the invention, and the combination of parts and economies of development and performance, will become more apparent upon consideration of the following detailed descriptions with reference to the accompanying drawings, all of which form a part of this specification.

BRIEF DESCRIPTION OF THE DRAWINGS

A further understanding of the present invention can be obtained by reference to the preferred embodiment set forth in the illustrations of the accompanying drawings. Although the illustrated embodiment is merely exemplary of systems for carrying out the present invention, both the organization, expanded configurations and method of operation of the invention, in general, together with further objectives and advantages thereof, may be more easily understood by reference to the drawings and the following description. The drawings are not intended to limit the scope of this invention, which is set forth with particularity in the claims as appended or as subsequently amended, but merely to clarify and exemplify the invention.

For a more complete understanding of the present invention, reference is now made to the following drawings in which:

FIG. 8 is a perspective view of the modular rack bracket of FIG. 2 wherein a rear-facing-forward electronic component is affixed to the apparatus and electrical cabling is attached to the rear-facing-forward electronic component and is supported by the frame member. The electrical cabling includes electrical supply cabling, signal cabling, or data cabling and the like.

DETAILED DESCRIPTION OF THE PREFERRED EMBODIMENTS

As required, a detailed illustrative embodiment of the present invention is disclosed herein. However, systems and operating structures in accordance with the present invention may be embodied in a wide variety of forms and modes, some of which may be quite different from those in the disclosed embodiment. Consequently, the specific structural and functional details disclosed herein are merely representative, yet in that regard, they are deemed to afford the best embodiment for purposes of disclosure and to provide a basis for the claims herein which define the scope of the present invention. The following presents a detailed description of a preferred embodiment (as well as some alternative embodiments) of the present invention.

Figure 1:
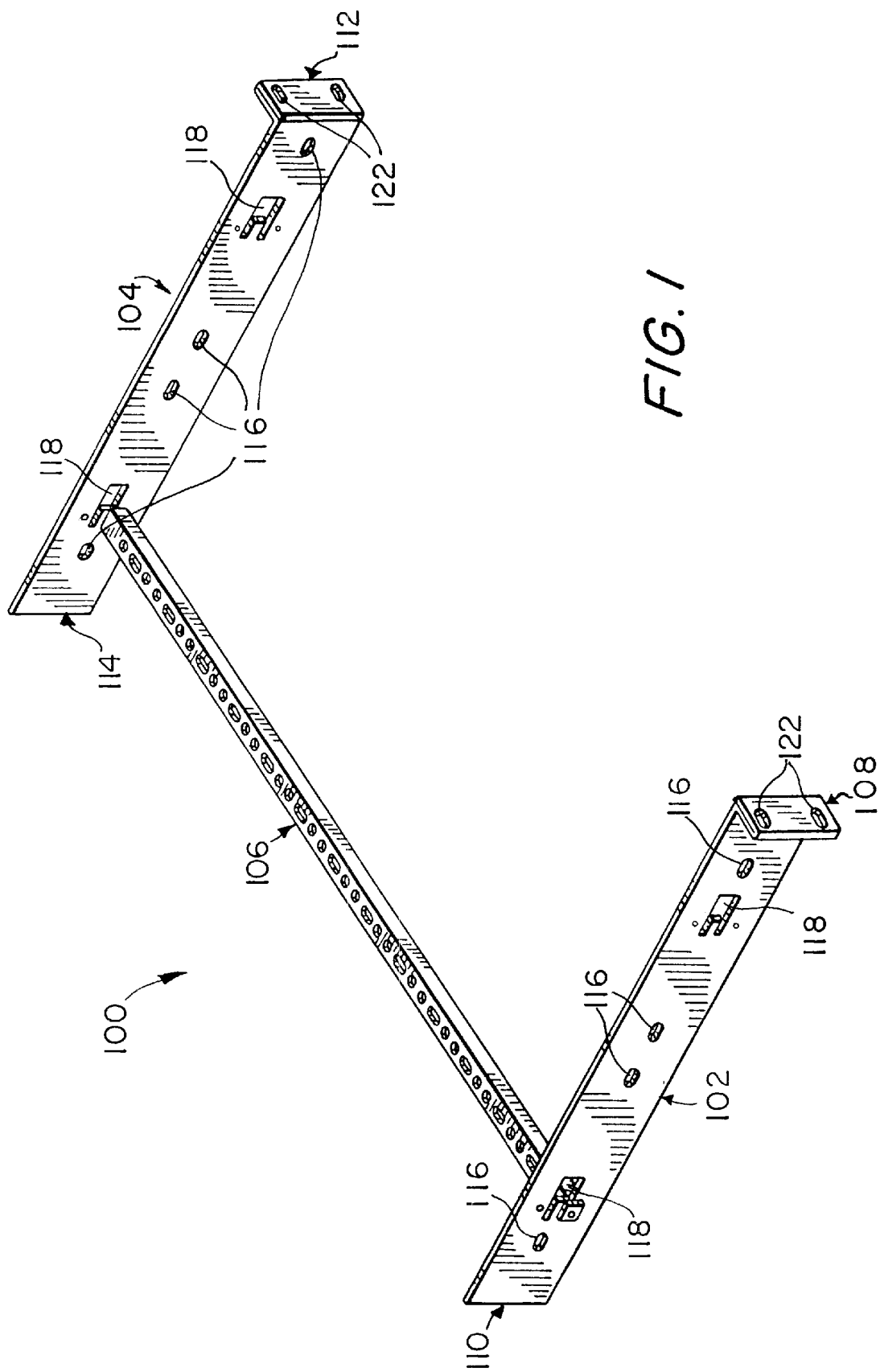
FIG. 1 is a perspective view of the preferred embodiment of the modular rack bracket for an electronic component according to the present invention, wherein a front-facing-forward electronic.component may be affixed.
Figure 7:
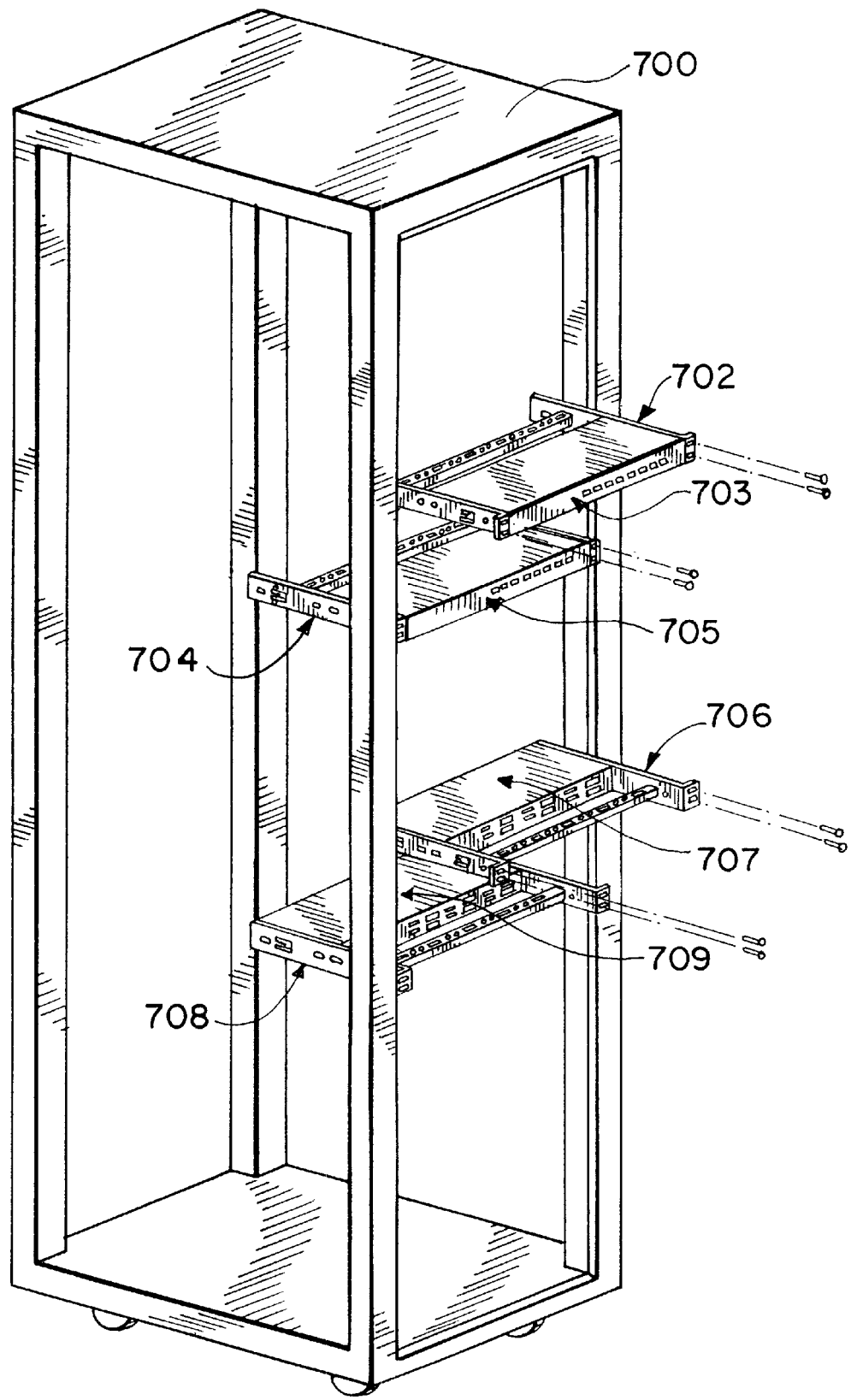
FIG. 7 is a perspective view of a rack system employing multiple modular rack brackets according to the present invention having either a front-facing-forward or a rear-facing-forward electronic component affixed therein.
Figure 8:
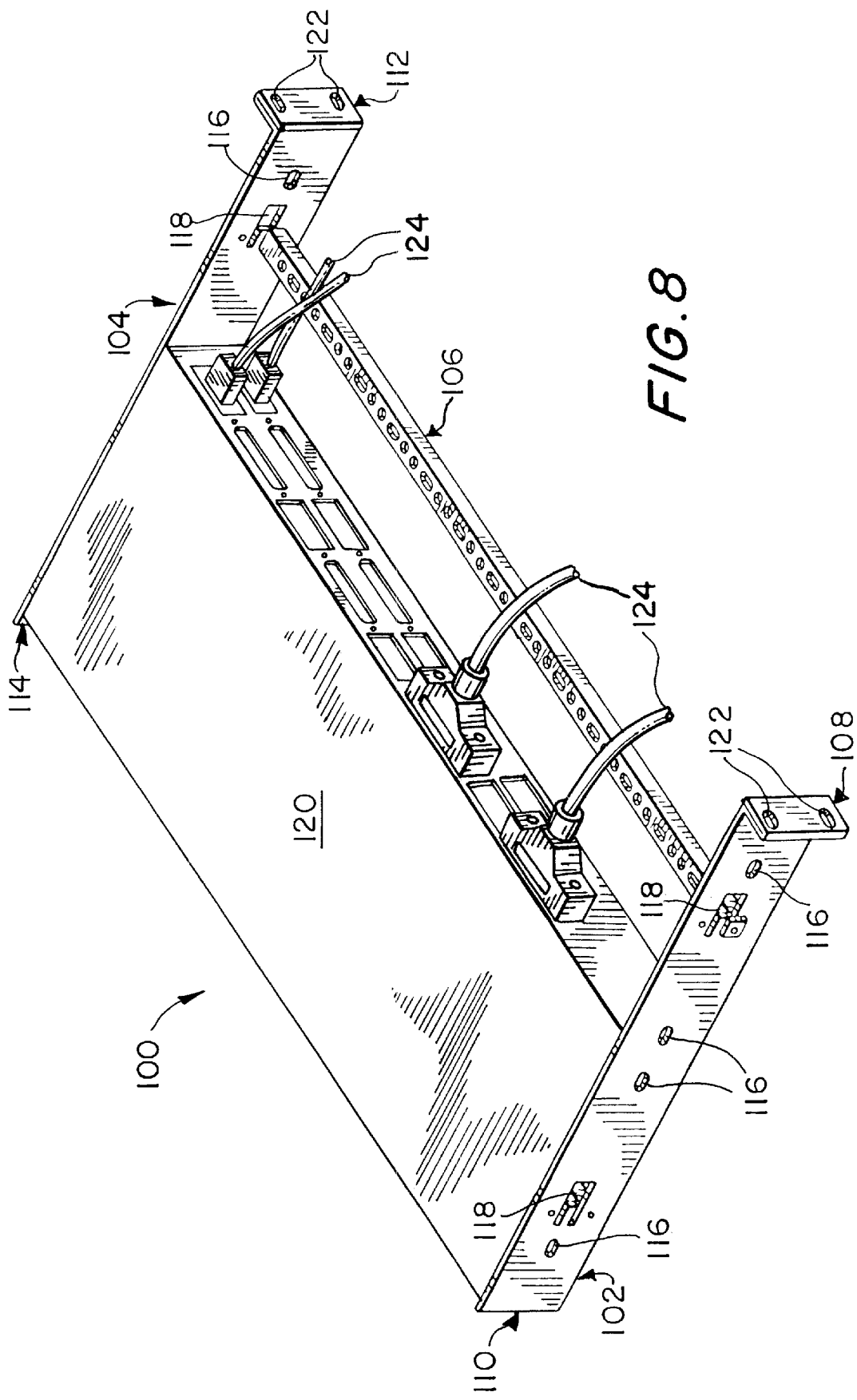

Referring first to FIG. 1, depicted is modular equipment rack bracket 100 for mounting electronic equipment in a front-facing-forward position including first mounting bracket arm 102 and second mounting bracket arm 104 for mounting to a rack assembly (as illustrated in FIG. 7) and frame member 106 for supporting a plurality of electrical supply cabling, signal cabling or data cabling and the like (as illustrated in FIG. 8). First mounting bracket arm 102 and second mounting bracket arm 104 each comprise front end 108, 112, respectively and back end 110, 114, respectively. Front end 108 of first mounting bracket arm 102 and front end 112 of second mounting bracket arm 104 are affixed via connecting means 122, for example, perpendicularly to the front of the rack assembly thereby allowing first mounting bracket arm 102 and second mounting bracket arm 104 to extend inwardly within the rack assembly. First and second mounting bracket arms 102, 104 respectively have associated therewith a plurality of fastener openings 116 for attaching any of a multitude of electronic components thereto in either a front-facing-forward or rear-facing-forward configuration. The fastener openings 116 may be compatible with all types of screws, bolts, nuts, clamps, pins, rivets, adhesives and the like. Although fastener openings 116 are utilized in the preferred embodiment, it is foreseeable that additional fastening means such as universal joints, tongue and grove joints, welded joints, wedged joints and the like may be an integral part of first and second mounting bracket arms 102 and 104. In addition, first and second mounting bracket arm 102 and 104 may comprise a plurality of coupling means 118 for affixing frame member 106 thereto. Frame member 106 is coupled, for example, perpendicularly to one of a plurality of coupling means 118 of first and second mounting bracket arms 102 and 104 allowing the electronic component to be affixed therein (i.e., between first mounting bracket arm 102 and second mounting bracket arm 104) in either a front-facing-forward or a rear-facing-forward configuration without removing the affixed first and second mounting bracket arms 102 and 104 from the rack assembly.

Coupling means 118 may include, but may not be limited to universal joints, tongue and grove joints, welded joints, wedged joints or other types of means known in the art. In addition, coupling means 118 may include, but not be limited to, the use of screws, bolts, nuts, clamps, pins, rivets, adhesives and the like. Frame member 106 is preferably provided for supporting a plurality of electrical cabling for either a front-facing-forward electronic component or a rear-facing-forward electronic component thereby reducing the weight strain of the cabling on the electronic component's cabling interfaces. In addition, the apparatus may further include optional bracing so that the rack is strengthened for use in areas prone to seismic occurrences.

Figure 2:
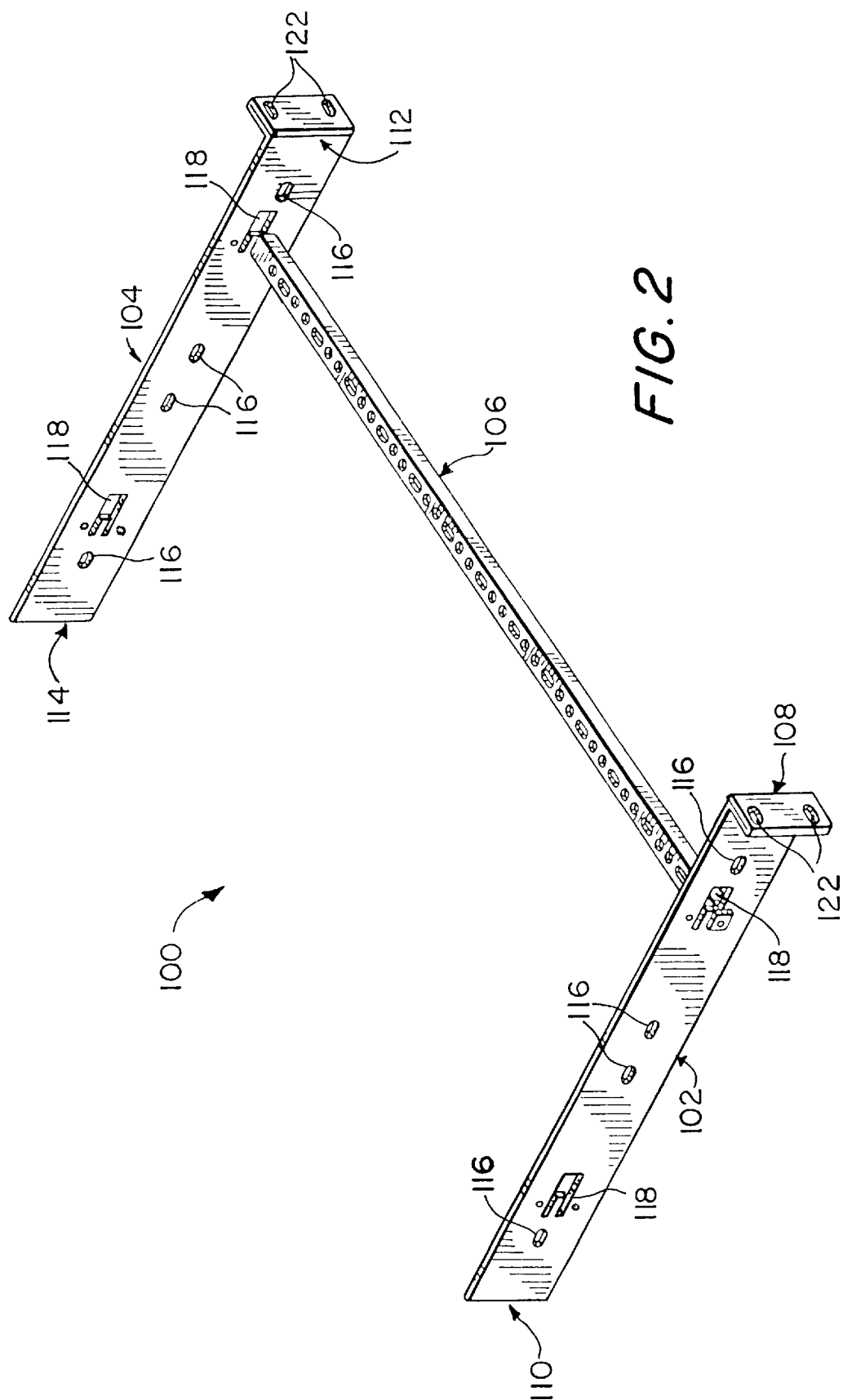
FIG. 2 is a perspective view of the preferred embodiment of the modular rack bracket for an electronic component according to the present invention, wherein a rear-facing-forward electronic component may be affixed.

Referring next to FIG. 2, depicted is modular equipment rack bracket 100 for mounting electronic equipment in a rear-facing-forward position including first mounting bracket arm 102 and second mounting bracket arm 104 for mounting to a rack assembly (as illustrated in FIG. 7) and frame member 106 for supporting a plurality of electrical supply cabling, signal cabling or data cabling and the like (as illustrated in FIG. 8). First mounting bracket arm 102 and second mounting bracket arm 104 each comprise front end 108, 112, respectively and back end 110, 114, respectively. Front end 108 of first mounting bracket arm 102 and front end 112 of second mounting bracket arm 104 are affixed via connecting means 122, for example, perpendicularly to the front of the rack assembly thereby allowing first mounting bracket arm 102 and second mounting bracket arm 104 to extend inwardly within the rack assembly. First and second mounting bracket arms 102, 104 respectively have associated therewith a plurality of fastener openings 116 for attaching any of a multitude of electronic components thereto in either a front-facing-forward or rear-facing-forward configuration. The fastener openings 116 may be compatible with all types of screws, bolts, nuts, clamps, pins, rivets, adhesives and the like. Although fastener openings 116 are utilized in the preferred embodiment, it is foreseeable that additional fastening means such as universal joints, tongue and grove joints, welded joints, wedged joints and the like may be an integral part of first and second mounting bracket arms 102 and 104. In addition, first and second mounting bracket arm 102 and 104 may comprise a plurality of coupling means 118 for affixing frame member 106 thereto. Frame member 106 is coupled, for example, perpendicularly to one of a plurality of coupling means 118 of first and second mounting bracket arms 102 and 104 allowing the electronic component to be affixed therein (i.e., between first mounting bracket arm 102 and second mounting bracket arm 104) in either a front-facing-forward or a rear-facing-forward configuration without removing the affixed first and second mounting bracket arms 102 and 104 from the rack assembly.

Coupling means 118 may include, but may not be limited to universal joints, tongue and grove joints, welded joints, wedged joints or other types of means known in the art. In addition, coupling means 118 may include, but not be limited to, the use of screws, bolts, nuts, clamps, pins, rivets, adhesives and the like. Frame member 106 is preferably provided for supporting a plurality of electrical cabling for either a front-facing-forward electronic component or a rear-facing-forward electronic component thereby reducing the weight strain of the cabling on the electronic component's cabling interfaces. In addition, the apparatus may further include optional bracing so that the rack is strengthened for use in areas prone to seismic occurrences.

Figure 3:
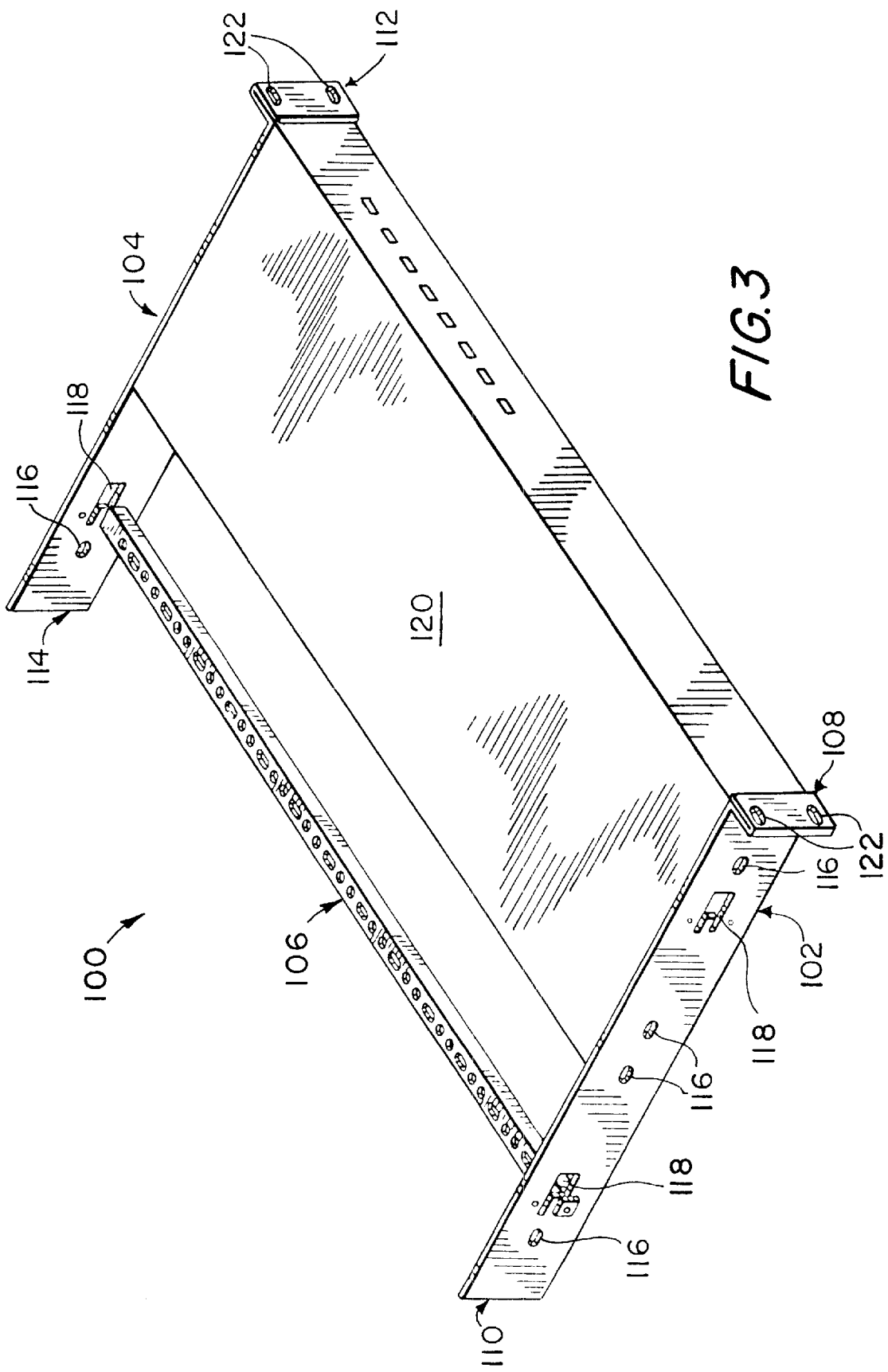
FIG. 3 is a perspective view of the modular rack bracket of FIG. 1 wherein a front-facing-forward electronic component is affixed to the apparatus.

Referring next to FIG. 3, depicted is modular equipment rack bracket 100 shown in FIG. 1 having electronic equipment 120 mounted therein in a front-facing-forward position. As described above with respect to FIG. 1, modular rack bracket 100 comprises first and second mounting bracket arms 102 and 104 for mounting to a rack assembly (as illustrated in FIG. 7) and frame member 106 for supporting a plurality of electrical supply cabling, signal cabling or data cabling and the like (as illustrated in FIG. 8). First and second mounting bracket arms 102 and 104 each comprise front end 108, 112 respectively, and back end 110, 114 respectively. Front end 108 of first mounting bracket arm 102 and front end 112 of second mounting bracket arm 104 are affixed via connecting means 122, for example, perpendicular to the front of the rack assembly thereby allowing first and second mounting bracket arms 102 and 104 to extend inwardly within the rack assembly. First and second mounting bracket arms 102 and 104 also may have associated therewith a plurality of fastener openings 116 for attaching electronic component 120 thereto. In addition, the first and second mounting bracket arms 102 and 104 may comprise a plurality of coupling means 118 for affixing frame member 106 thereto. Frame member 106 is then coupled, for example, perpendicular to at least one of coupling means 118 of each of first and second mounting bracket arms 102 and 104. Preferably, frame member 106 is provided for supporting a plurality of electrical cabling thereby reducing the weight strain of the cabling on the electronic component's cabling interfaces.

Figure 4:
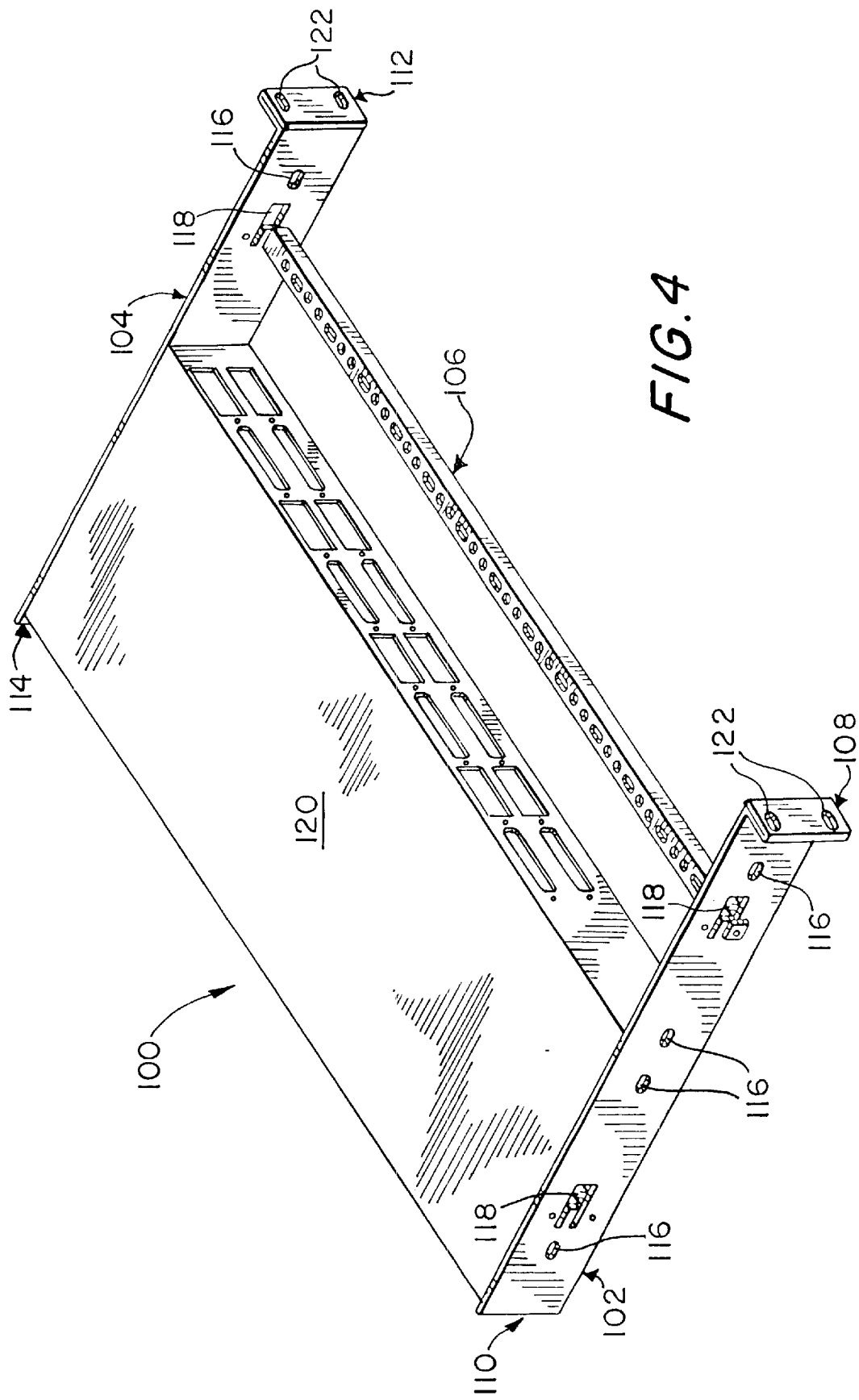
FIG. 4 is a perspective view of the modular rack bracket of FIG. 2 wherein a rear-facing-forward electronic component is affixed to the apparatus.

Referring next to FIG. 4, depicted is modular equipment rack bracket 100 shown in FIG. 1 having electronic equipment 120 mounted therein in a rear-facing-forward position. As described above with respect to FIG. 1, modular rack bracket 100 comprises first and second mounting bracket arms 102 and 104 for mounting to a rack assembly (as illustrated in FIG. 7) and frame member 106 for supporting a plurality of electrical supply cabling, signal cabling or data cabling and the like (as illustrated in FIG. 8). First and second mounting bracket arm 102 and 104 each comprise front end 108, 112 respectively, and back end 110, 114 respectively. Front end 108 of first mounting bracket arm 102 and front end 112 of second mounting bracket arm 104 are affixed via connecting means 122, for example, perpendicular to the front of the rack assembly thereby allowing first and second mounting bracket arms 102 and 104 to extend inwardly within the rack assembly. First and second mounting bracket arm 102 and 104 also may have associated therewith a plurality of fastener openings 116 for attaching electronic component 120 thereto. In addition, the first and second mounting bracket arms 102 and 104 may comprise a plurality of coupling means 118 for affixing frame member 106 thereto. Frame member 106 is then coupled, for example, perpendicular to at least one of coupling means 118 of each of first and second mounting bracket arms 102 and 104. Preferably, frame member 106 is provided for supporting a plurality of electrical cabling thereby reducing the weight strain of the cabling on the electronic component's cabling interfaces.

Figure 5:
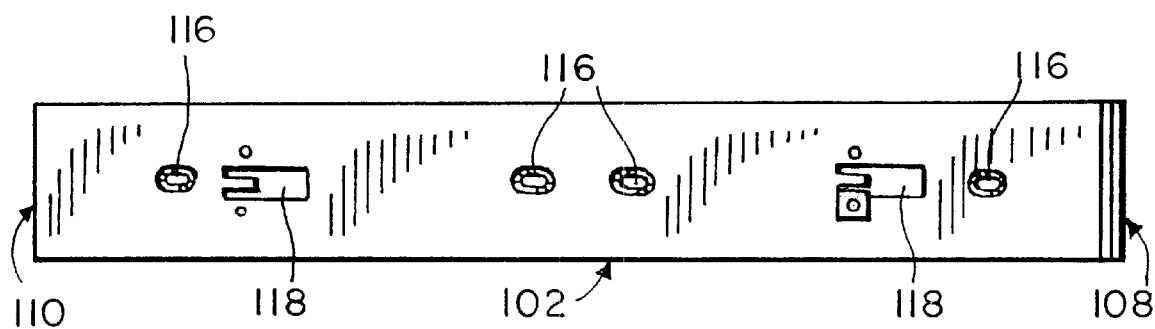
FIG. 5 is a side view of one of the mounting bracket arms of the modular rack bracket shown in FIGS. 1 and 2.

Referring next to FIG. 5, depicted is a side view of first mounting bracket arm 102. Preferably, front end 108 of first mounting bracket arm 102 is positioned, for example, such that it is perpendicular to the front of a rack assembly thereby allowing first mounting bracket arm 102 to extend inwardly within a rack assembly. Also first mounting bracket arm 102 may have associated therewith a plurality of fastener openings 116 for attaching any of a multitude of electronic components thereto in either a front-facing-forward or a rear-facing-forward configuration. Fastener openings 116 may be compatible with all types of screws, bolts, nuts, clamps, pins, rivets, adhesives and the like. Although fastener openings 116 are utilized in the preferred embodiment, it is foreseeable that additional fastening means such as universal joints, tongue and grove joints, welded joints, wedged joints and the like may be used with the first and second mounting bracket arms 102 and 104 for attaching the electronic components thereto. Furthermore, the arrangement of fastener openings 116 or other fastening means may be altered to accommodate a plurality of electronic components. In addition, first mounting bracket arm 102 preferably comprises a plurality of coupling means 118 for attaching frame member 106 thereto in a perpendicular position. In the preferred embodiment, second mounting bracket arm 104 is a symmetrical counterpart to first mounting bracket arm 102 shown in FIG. 5.

Figure 6:
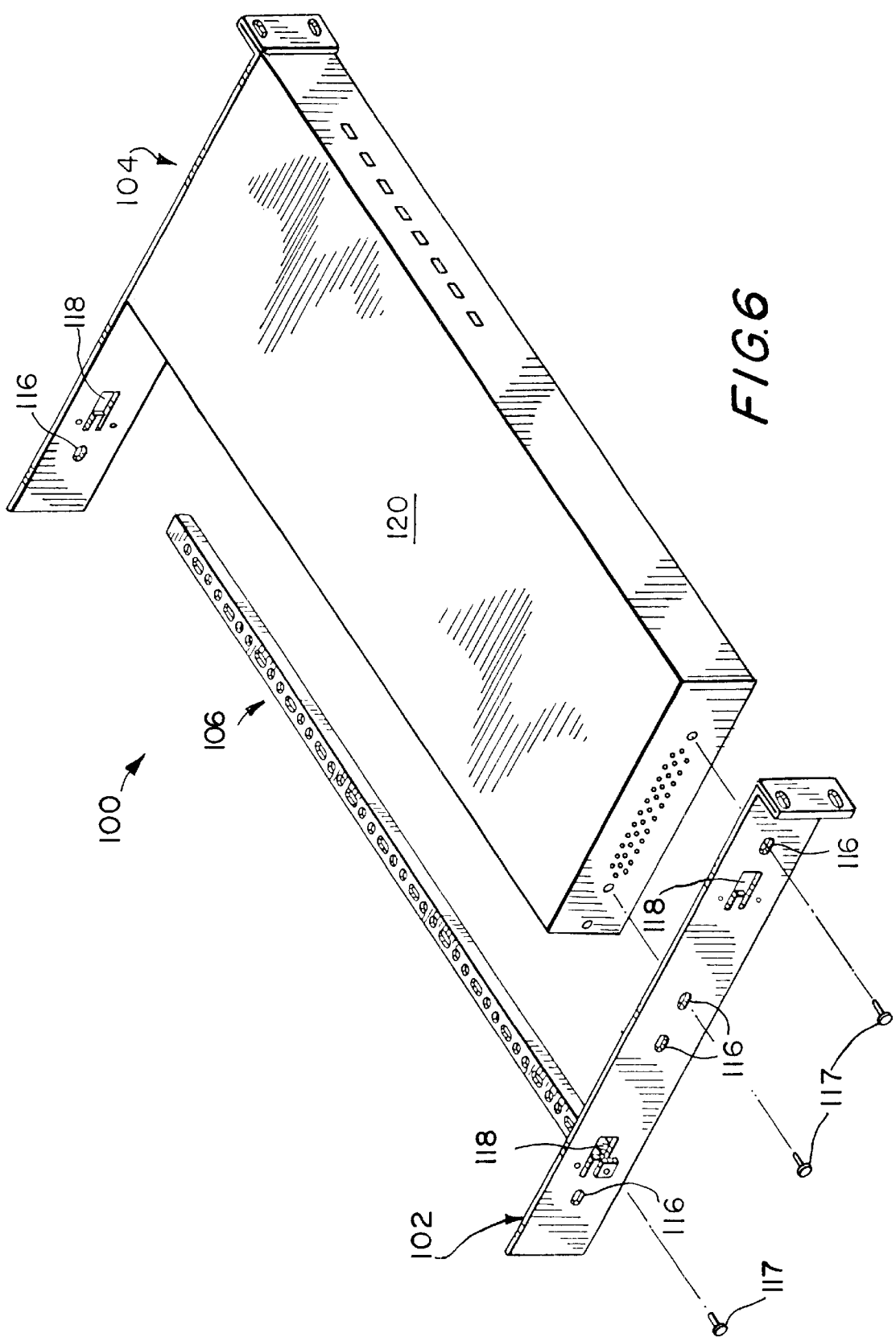
FIG. 6 is an exploded perspective view of the modular rack bracket of FIG. 3 showing the means for attaching a plurality of types of electronic components and the means for coupling the frame member to the mounting bracket arms.

Turning next to FIG. 6, depicted is an exploded perspective view of modular equipment rack bracket 100 shown in FIG. 3, further showing the attachment of electronic component 120 to first mounting bracket arm 102 using screws 117. Of course other types of fasteners may be used. Also shown is coupling means 118 for coupling frame member 106 to first and second mounting bracket arms 102 and 104. Although numerous types of attachment means (i.e., screws 117 through fastener openings 116) and coupling means 118 are known in the art, depicted in the preferred embodiment is a screw-type assembly for attachment means 116 and tongue and grove joints fastened by a screw-type connection for coupling means 118.

Referring next to FIG. 7, depicted is a perspective view of rack system 700 employing several modular equipment rack brackets 702, 704, 706 and 708 and attached electronic components 703, 705, 707 and 709 affixed to a standard rack system 700. In accordance with the preferred embodiment of the modular equipment rack bracket of the invention, numerous electronic components may be configured in spaced parallel relationship dependant on the size of the electronic components as well as the size of the rack system. Furthermore, in accordance with the invention, several modular rack brackets (e.g., brackets 702 and 706) and their attached electronic components (e.g., components 703 and 707) may be easily affixed to rack system 700. Furthermore, as depicted, once modular rack brackets 702 and 706 are mounted, they are positioned such that they extend inward of rack system 700, as shown by modular rack brackets 704 and 708. As shown, modular rack brackets 702 and 704 are attached in a front-facing-forward position, each having an electronic component positioned therein. Also, modular rack bracket 706 and 708 are shown as attached in a rear-facing-forward position each having an electronic component positioned therein.

Referring next to FIG. 8, depicted is modular equipment rack bracket 100 shown in FIG. 4 having electronic equipment 120 mounted therein in a rear-facing-forward position. As described above with respect to FIG. 1, modular rack bracket 100 comprises first and second mounting bracket arms 102 and 104 for mounting to a rack assembly (as illustrated in FIG. 7) and frame member 106 for supporting a plurality of electrical cabling 124 including supply cabling, signal cabling or data cabling and the like. First and second mounting bracket arm 102 and 104 each comprise front end 108, 112 respectively, and back end 110, 114 respectively. Front end 108 of first mounting bracket arm 102 and front end 112 of second mounting bracket arm 104 are affixed via connecting means 122, for example, perpendicular to the front of the rack assembly thereby allowing first and second mounting bracket arms 102 and 104 to extend inwardly within the rack assembly. First and second mounting bracket arm 102 and 104 also may have associated therewith a plurality of fastener openings 116 for attaching electronic component 120 thereto. In addition, the first and second mounting bracket arms 102 and 104 may comprise a plurality of coupling means 118 for affixing frame member 106 thereto. Frame member 106 is then coupled, for example, perpendicular to at least one of coupling means 118 of each of first and second mounting bracket arms 102 and 104. Preferably, frame member 106 is provided for supporting a plurality of electrical cabling 124 thereby reducing the weight strain of the electrical cabling 124 on the electronic component's cabling interfaces.

While the present invention has been described with reference to the preferred embodiments and several alternative embodiments, which embodiments have been set forth in considerable detail for the purposes of making a complete disclosure of the invention, such embodiments are merely exemplary and are not intended to be limiting or represent an exhaustive enumeration of all aspects of the invention. The scope of the invention, therefore, shall be defined solely by the following claims. Further, it will be apparent to those of skill in the art that numerous changes may be made in such details without departing from the spirit and the principles of the invention. It should be appreciated that the present invention is capable of being embodied in other forms without departing from its essential characteristics.

We claim:

1. A modular equipment rack bracket for mounting an electronic component within a rack system comprising:

a first mounting bracket arm, comprising a plurality of first coupling means;

a second mounting bracket arm, comprising a plurality of second coupling means; and a frame member coupling to at least one of said plurality of first coupling means and said plurality of second coupling means; wherein said plurality of said first coupling means and said second coupling means allows said frame member to couple at a multitude of points along said first mounting bracket arm and said second mounting bracket arm, thereby allowing said electronic component to couple to said first mounting bracket arm and said second mounting bracket arm in both a front-facing-forward and or rear-facing-forward configurations.

2. A modular equipment rack bracket as set forth in claim 1 wherein said first mounting bracket arm and said second mounting bracket arm each have associated therewith a front end and a back end, said front end of each of said first mounting bracket arm and said second mounting bracket arm each having a plurality of connecting means for affixing said modular equipment rack bracket to a rack system.

3. A modular equipment rack bracket as set forth in claim 2 wherein the connecting means are selected one from the group consisting of screw-type means, bolt-type means, nut-type means, clamp-type means, pin-type means, rivet-type means and adhesive-type means.

4. A modular equipment rack bracket as set forth in claim 1 wherein said first mounting bracket arm and second mounting bracket arm are mounted at a plurality of positions within said rack system.

5. A modular equipment rack bracket as set forth in claim 1 wherein said first mounting bracket arm, second mounting bracket arm and frame member are configured to be of sufficient size for mounting a computer processing unit therein.

6. A modular equipment rack bracket as set forth in claim 1 wherein said first mounting bracket arm, second mounting bracket arm and frame member are configured to be of sufficient size for mounting an electronic video component therein.

7. A modular equipment rack bracket as set forth in claim 1 wherein said first mounting bracket arm, second mounting bracket arm and frame member are configured to be of sufficient size for mounting an electronic audio component therein.

8. A modular equipment rack bracket as set forth in claim 1 wherein said first mounting bracket arm, second mounting bracket arm and frame member are configured to be of sufficient size for mounting a plurality of components of an intelligent modular server management system therein.

9. A modular equipment rack bracket as set forth in claim 1 wherein said first mounting bracket arm and said second mounting bracket arm each comprise a plurality of fastener openings for attaching a plurality of electronic components thereto.

10. A modular equipment rack bracket as set forth in claim 9 wherein said fastener openings are compatible with fastening means selected one from the group consisting of screw-type means, bolt-type means, nut-type means, clamp-type means, pin-type means, rivet-type means, adhesive-type means.

11. A modular equipment rack bracket as set forth in claim 1 wherein said first coupling means and said second coupling means are selected one from the group consisting of universal joints, tongue and groove joints, welded joints and wedged joints.

12. A modular equipment rack bracket as set forth in claim 1 wherein said first mounting bracket arm, second mounting bracket arm, frame member and rack system are constructed of sufficiently strengthened material to be used in areas prone to seismic occurrences.

13. A modular equipment rack bracket as set forth in claim 1 wherein said frame member is constructed of sufficient material for supporting a plurality of electronic cables.

14. A modular equipment rack bracket as set forth in claim 13 wherein said electronic cables comprise unshielded twisted pair cable such as category 5 "UTP" cabling.

15. A modular equipment rack bracket as set forth in claim 13 wherein said electronic cables comprise co-axial cabling.

16. A method for mounting a plurality of electronic components in a rack system comprising the steps of:

attaching a plurality of equipment rack brackets to said rack system;

mounting at least one of said plurality of electronic components on at least one of said equipment rack brackets, wherein said equipment rack bracket can attach said electronic component in both a front-facing-forward configuration and a rear-facing forward configuration; and attaching a frame member for supporting electronic component cabling to at least one of said equipment rack brackets, wherein said frame member allows said electronic component to be affixed therein in both a front-facing-forward configuration and a rear-facing-forward configuration.

17. A method for mounting an electronic component in a rack system as set forth in claim 16 wherein at least one of said plurality of electronic components is a computer processing unit.

18. A method for mounting an electronic component in a rack system as set forth in claim 16 wherein said plurality of electronic components comprises an intelligent modular server management system.

19. A method for mounting an electronic component in a rack system as set forth in claim 16 wherein at least one of said plurality of electronic components is an electronic audio component.

20. A method for mounting an electronic component in a rack system as set forth in claim 16 wherein at least one of said plurality of electronic components is an electronic video component.

21. A method for mounting an electronic component in a rack system as set forth in claim 16 wherein said frame member is constructed of material that can support a plurality of electronic cables.

22. A method for mounting an electronic component in a rack system as set forth in claim 16 wherein said electronic component cabling comprises unshielded twisted pair cable such as category 5 "UTP" cabling.

23. A method for mounting an electronic component in a rack system as set forth in claim 16 wherein said electronic component cabling comprises co-axial cabling.

24. A method for mounting an electronic component in a rack system as set forth in claim 16 wherein said first mounting bracket arm, second mounting bracket arm, frame member and rack system are constructed of sufficiently strengthened material to be used in areas prone to seismic occurrences.

25. A modular equipment rack bracket for mounting an electronic component within a rack system comprising:

a first mounting bracket arm, comprising a plurality of first coupling means;

a second mounting bracket arm, comprising a plurality of second coupling means; and a frame member, supporting any combination of wires, cables, or cords, and said frame member coupling to at least one of said plurality of first coupling means and second coupling means;

wherein said plurality of said first coupling means and said second coupling means allow said frame member to be coupled at a multitude of points along said first mounting bracket arm and said second mounting bracket arm, thereby allowing said electronic component to couple to said first mounting bracket arm and said second mounting bracket arm in both a front-facing-forward and or rear-facing-forward configurations.

26. A modular equipment rack bracket as set forth in claim 25 wherein said first mounting bracket arm and said second mounting bracket arm each have associated therewith a front end and a back end, said front end of said first mounting bracket arm and said second mounting bracket arm each having a plurality of connecting means for affixing said modular equipment rack bracket to said rack system.

27. A modular equipment rack bracket as set forth in claim 26 wherein said plurality of connecting means are selected one from the group consisting of screw-type means, bolt-type means, nut-type means, clamp-type means, pin-type means, rivet-type means and adhesive-type means.

28. A modular equipment rack bracket as set forth in claim 25 wherein said first mounting bracket arm and said second mounting bracket arm are mounted at a plurality of positions within said rack system.

29. A modular equipment rack bracket as set forth in claim 25 wherein said first mounting bracket arm, said second mounting bracket arm and said frame member are configured to be of sufficient size for mounting a computer processing unit therein.

30. A modular equipment rack bracket as set forth in claim 25 wherein said first mounting bracket arm, said second mounting bracket arm and said frame member are configured to be of sufficient size for mounting an electronic video component therein.

31. A modular equipment rack bracket as set forth in claim 25 wherein said first mounting bracket arm, said second mounting bracket arm and said frame member are configured to be of sufficient size for mounting an electronic audio component therein.

32. A modular equipment rack bracket as set forth in claim 25 wherein said first mounting bracket arm, said second mounting bracket arm and said frame member are configured to be of sufficient size for mounting a plurality of components of an intelligent, modular, server management system therein.

33. A modular equipment rack bracket as set forth in claim 25 wherein said first mounting bracket arm and said second mounting bracket arm each comprise a plurality of fastener openings for attaching a multitude of electronic components thereto.

34. A modular equipment rack bracket as set forth in claim 25 wherein said first mounting bracket arm and said second mounting bracket arm each comprise a plurality of fastener openings for attaching a multitude of electronic components thereto, wherein said fastener openings are compatible with fastening means selected one from the group consisting of screw-type means, bolt-type means, nut-type means, clamp-type means, pin-type means, rivet-type means and adhesive-type means.

35. A modular equipment rack bracket as set forth in claim 25 wherein said plurality of first coupling means and said plurality of second coupling means are selected from the group consisting of universal joints, tongue and grove joints, welded joints and wedged joints.

36. A modular equipment rack bracket as set forth in claim 25 wherein said first mounting bracket arm, said second mounting bracket arm, said frame member and said rack system are constructed of sufficiently strengthened material to be used in areas prone to seismic occurrences.

37. A modular equipment rack bracket as set forth in claim 25 wherein said frame member supports a plurality of electronic cables.

38. A modular equipment rack bracket as set forth in claim 37 wherein said electronic cables comprise unshielded twisted pair cabling such as category 5 "UTP" cabling.

39. A modular equipment rack bracket as set forth in claim 37 wherein said electronic cables comprise co-axial cabling.

* * * * *